United States Patent [19]

Kruzhanov et al.

[11] 4,195,354
[45] Mar. 25, 1980

[54] SEMICONDUCTOR MATRIX FOR INTEGRATED READ-ONLY STORAGE

[76] Inventors: Jury V. Kruzhanov, 103498, korpus 431, kv. 112; Viktor P. Dubinin, 103498, korpus 445, kv. 120; Viktor S. Ovchinnikov, 103527, korpus 839, kv. 11; Vladimir E. Safronov, 103527, korpus 811, kv. 146, all of Moscow, U.S.S.R.

[21] Appl. No.: 931,422

[22] Filed: Aug. 7, 1978

[30] Foreign Application Priority Data

Aug. 16, 1977 [SU] U.S.S.R. ............... 2517209[1]

[51] Int. Cl.² .................................. G11C 11/36
[52] U.S. Cl. ............................. 365/105; 357/20
[58] Field of Search .............. 365/94, 103, 104, 105; 357/20, 45

[56] References Cited

U.S. PATENT DOCUMENTS 3,717,852  2/1973  Abbas et al. .................... 365/103

OTHER PUBLICATIONS

Abbas, Electronically Encodable Read-only Store, IBM Technical Disclosure Bulletin, vol. 13, No. 6, 11/70, pp. 1426-1427.

Gaesslen, Schottky Barrier Read-only Memory, IBM Technical Disclosure Bulletin, vol. 14, No. 1, 6/71, p. 252.

Primary Examiner—Stuart N. Hecker
Attorney, Agent, or Firm—Steinberg & Blake

[57] ABSTRACT

A semiconductor matrix for an integrated read-only storage is disclosed which comprises a plurality of components each of which is provided with a semiconductor region of a first type conductivity, at least some components of said components each having a semiconductor region of a second type conductivity disposed in said first type conductivity semiconductor region. Said components are formed at the locations where semiconductor buses of said first type conductivity, made in a substrate, intersect metallic buses disposed on a dielectric layer which is adapted to isolate the semiconductor buses from the metallic ones. There are windows comprising openings which register with them and are adapted to provide for electric contact between the second type conductivity semiconductor regions and the metallic buses, said windows are formed in the dielectric layer above said second type conductivity semiconductor regions of respective components.

1 Claim, 1 Drawing Figure

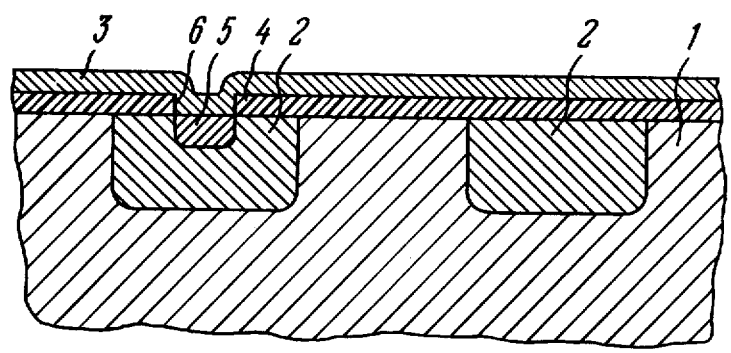

SEMICONDUCTOR MATRIX FOR INTEGRATED READ-ONLY STORAGE

FIELD OF THE INVENTION

The invention relates to static storage devices, and more particularly to a semiconductor matrix for an integrated read-only storage suitable for use with accounting and controlling computers, with data acquisition and processing systems, and with various test and control apparatus.

DESCRIPTION OF THE PRIOR ART

Known in the art is a semiconductor matrix for an integrated read-only storage (cf. U.S. Pat. No. 3,721,964, cl. G11c, 7/00), comprising a plurality of components each of which is provided with a semiconductor region of a first type conductivity and a semiconductor region of a second type conductivity located in the latter. The components are formed at the locations where semiconductor buses of said first type conductivity intersect metallic buses disposed in a dielectric layer which is adapted to isolate the semiconductor buses from the metallic buses. The semiconductor buses are made in the upper layer of a two-layer semiconductor substrate, the upper layer of the substrate having said second type conductivity, and the lower layer of the substrate having said first type conductivity. There are windows covered with another dielectric layer, located above the second type conductivity semiconductor regions and made in the first dielectric layer, some of the windows having openings to provide for electric contact between the second type conductivity semiconductor regions and the metallic buses.

The known matrix has each of its components provided with a second type conductivity semiconductor region and a window located above the latter, but some of these regions are void of openings made above them in the first dielectric layer. Since the openings are made in certain windows only, there is a gap between the boundaries of a window and an opening, which does not allow for a decrease in the size of the window so as to obtain that size equal to that of the opening. The size of a second type conductivity semiconductor region is determined by the size of an opening above it; therefore, the area of the p-n junction between the second type conductivity semiconductor region and the first type conductivity semiconductor region, and the capacitance of that p-n junction, are also determined by the window size which cannot be reduced to the opening size due to the availability of the above-mentioned gap. This tends to limit the extent of integration and speed of operation of the associated integrated read-only storage.

SUMMARY OF THE INVENTION

An object of the invention is to provide for a greater extent of integration of an integrated read-only storage.

Another object of the invention is to provide for a greater speed of operation of an integrated read-only storage.

There is disclosed a semiconductor matrix for an integrated read-only storage, comprising a plurality of components each of which is provided with a semiconductor region of a first type conductivity, at least some components of said components each having a semiconductor region of a second type conductivity disposed in said first type conductivity semiconductor region, said components being formed at the locations where semiconductor buses of said first type conductivity, made in a substrate, intersect metallic buses disposed on a dielectric layer which is adapted to isolate the semiconductor buses from the metallic buses, windows being made in the dielectric layer above the second type conductivity semiconductor regions, some of the windows having openings to provide for electric contact between the second type conductivity semiconductor regions and the metallic buses, which matrix being characterized in that only those components of said components, above which the openings registering with the windows are located, are provided with the second type conductivity semiconductor regions.

In the disclosed matrix, the second type conductivity semiconductor regions with the windows disposed above them are incorporated only in those components which have the openings. It is therefore possible to combine the windows and the openings made in the dielectric layer. As a result, the area of the p-n junction between the second type conductivity semiconductor region and the first type conductivity semiconductor region as well as the capacitance of that p-n junction are reduced, which results in a greater extent of integration and speed of operation of the integrated read-only storage.

The invention will now be described, by way of example, with reference to the accompanying drawing which shows a lateral section of a portion of a semiconductor matrix for an integrated read-only storage, according to the invention.

DESCRIPTION OF THE INVENTION

A semiconductor substrate 1 comprises semiconductor buses 2 of a first type conductivity opposite to that of the semiconductor substrate 1.

The components of the matrix of the invention are formed at the locations where the semiconductor buses 2 intersect metallic buses 3 disposed on a dielectric layer 4 which is used to isolate the semiconductor buses 2 from the metallic buses 3. At least some components of said components each have a semiconductor region 5 of a second type conductivity, disposed in the semiconductor bus 2.

There are windows above the semiconductor regions 5 with which openings 6 are registered, said openings 6 being made in the dielectric layer 4 and being disposed above those components which comprise the semiconductor regions 5.

Assume that the prior art and disclosed matrices for an integrated read-only storage have a specification as follows: identical openings in the dielectric layer 4 each having an area of $3 \times 3$ $\mu m^2$; identical depth of the regions 5 equal to 1 $\mu m$; and the value of the gap between the boundaries of the window and the opening, in the prior art matrix, equal to 2 $\mu m$. With these parameters, the disclosed matrix has the area of the above p-n junction decreased by a factor of 2 (and therefore a greater extent of integration) and has the capacitance of the above p-n junction decreased by a factor of 2.5 (and therefore a greater speed of operation), as compared to the prior art matrix.

With the disclosed matrix used as an accumulator and/or decoder of an integrated read-only storage, the capacity of the latter is increased to a superhigh level and such a storage can be implemented as part of a single-chip computer.

Embodiments of the invention will now be described by way of the following Examples.

EXAMPLE 1

The substrate 1 is made of p-type silicon to which boron is added to obtain a concentration level of $5.10^{16} cm^{-3}$.

The buses 2 are made of n-type silicon to which phosphorus is added to obtain a concentration level of $5.10^{17} cm^{-3}$.

The regions 5 are made of p-type silicon to which boron is added to obtain a concentration level of $5.10^{18} cm^{-3}$.

The dielectric layer 4 is made of silicon dioxide.

The metallic buses 3 are made of molybdenum.

The fabrication of the matrix of the invention in accordance with the above requirements includes the steps as follows: the oxide is grown; windows are opened in the latter to allow for the introduction of phosphorus; phosphorus is used for ion doping; phosphorus is subject to diffusion and simultaneous oxidation is effected; windows are opened in the oxide to introduce boron and ion doping with boron is then performed.

At the final stage, molybdenum connections are formed and heating is effected to activate the impurity.

EXAMPLE 2

The substrate 1 is made of n-type silicon to which phosphorus is added to obtain a concentration level of $10^{16} cm^{-3}$.

The buses 2 are made of p-type silicon to which boron is added to obtain a concentration level of $10^{17} cm^{-3}$.

The regions 5 are made of n-type silicon to which arsenic is added to obtain a concentration level of $10^{19} cm^{-3}$.

The dielectric layer 4 is a layer of silicon dioxide.

The metallic buses 3 are made of aluminum.

The fabrication of the matrix of the invention in accordance with the above requirements includes the steps as follows: the oxide is grown; windows are opened in the latter to allow for the introduction of boron; boron is used for ion doping; boron is subject to diffusion and similtaneous oxidation is effected; windows are opened in the oxide to introduce arsenic and ion doping with arsenic is then performed.

At the final step, heating is effected to provide for the activation of the impurity and aluminum connections are formed.

What is claimed is:

1. A semiconductor matrix for an integrated read-only storage, comprising:

a substrate;

semiconductor buses of a first type conductivity, formed in said substrate;

metallic buses arranged in an intersection relationship to said semiconductor buses of said first type conductivity;

a dielectric layer having said metallic buses disposed thereon and adapted to isolate said semiconductor buses from said metallic buses;

a plurality of components of said matrix, formed at the locations where said semiconductor buses of said first type conductivity intersect said metallic buses and implemented on the basis of a semiconductor region of said first type conductivity, only some components of said components therein having a second type conductivity; and windows formed in said dielectric layer above said second type conductivity semiconductor regions of said some components and comprising openings registered with said windows so that the area of p-n junction between the second type conductivity semiconductor region and the first type conductivity semiconductor region as well as the capacitance of said p-n junction are reduced, thereby providing increased integration and speed of operation of the integrated read-only storage.

* * * * *